(12) United States Patent
Li

(10) Patent No.: US 6,979,877 B1
(45) Date of Patent: *Dec. 27, 2005

(54) SOLID-STATE DEVICE

(76) Inventor: Chou H. Li, 8001 Sailboat Key Blvd. #404, S. Pasadena, FL (US) 33707

( * ) Notice: Subject to any disclaimer, the term of this patent is extended or adjusted under 35 U.S.C. 154(b) by 0 days.

This patent is subject to a terminal disclaimer.

(21) Appl. No.: 08/313,350

(22) Filed: Sep. 27, 1994

Related U.S. Application Data

(63) Continuation-in-part of application No. 08/483,938, filed on Jun. 7, 1995, which is a continuation-in-part of application No. 08/483,937, filed on Jun. 7, 1995, which is a continuation-in-part of application No. 08/446,423, filed on May 22, 1995, now Pat. No. 5,696,402, which is a continuation of application No. 08/340,793, filed on Nov. 15, 1994, which is a continuation-in-part of application No. 07/809,460, filed on Dec. 31, 1991, now abandoned, and a continuation-in-part of application No. 07/816,626, filed on Dec. 9, 1991, now abandoned, which is a continuation-in-part of application No. 07/438,692, filed on Nov. 17, 1989, now Pat. No. 5,082,793, and a continuation-in-part of application No. 05/838,758, filed on Oct. 3, 1977, now Pat. No. 4,916,513, which is a continuation of application No. 05/386,102, filed on Aug. 6, 1973, now Pat. No. 4,946,800, which is a continuation-in-part of application No. 05/154,300, filed on Jun. 18, 1971, now abandoned, which is a continuation-in-part of application No. 04/761,646, filed on Sep. 23, 1968, now Pat. No. 3,585,714, which is a continuation-in-part of application No. 04/490,955, filed on Sep. 28, 1965, now Pat. No. 3,430,109.

(51) Int. Cl.$^7$ .............................................. H01L 29/00
(52) U.S. Cl. ...................... 257/510; 257/622; 257/653
(58) Field of Search ................................ 257/510, 622, 257/653

(56) References Cited

U.S. PATENT DOCUMENTS 3,283,171 A   11/1966   Seeds 3,426,253 A   2/1969   LaRocque et al.

(Continued)

FOREIGN PATENT DOCUMENTS

| GB | 1086607 | * 10/1967 |
|----|---------|-----------|
| JP | S34-2529 | 4/1959 |

OTHER PUBLICATIONS

V. Y. Doo et al., "Making Monolithic Semiconductor Structures for Integrated Circuits Using Composite Insulation and Junction Isolation Techniques" IBM Technical Disclosure Bulletin, vol. 8, No. 4 (Sep. 1965) pp. 659–660.*

V. Y. Doo et al., "Making Monolithic Semiconductor Structures for Integrated Circuits Using Composite insulation and Junction Isolation," IBM Technical Disclosure Bulletin, vol. 8, No. 4 (Sep. 1965) pp. 659–660.*

(Continued)

*Primary Examiner*—Sara Crane

(57) ABSTRACT

A method of making dielectrically isolated solid state device comprising state device (including integrated circuits) comprises providing a silicon wafer having a PN junction or other electronic rectifying barrier contained therein and thermally growing or ion-implanting selected ions to an oxide or nitride isolating groove in-situ to isolate it into a plurality of physically integral pockets for use as electrically separately operable components. The groove has a symmetrical, centrally rounded bottom which is located within a few microns below the PN junction or rectifying barrier. Through the unique oxide/nitride forming conditions and through curvature, symmetry, and proximity effects, novel passivation and isolation results obtain.

28 Claims, 2 Drawing Sheets

U.S. PATENT DOCUMENTS

| | | | |
|---|---|---|---|
| 3,430,109 A | | 2/1969 | Li |
| 3,500,139 A | * | 3/1970 | Frouin et al. ............... 148/175 |
| 3,515,956 A | * | 6/1970 | Martin et al. ................ 148/1.5 |
| 3,585,714 A | | 6/1971 | Li |
| 3,586,542 A | * | 6/1971 | MacRae ...................... 437/24 |
| 3,608,186 A | * | 9/1971 | Hutson ....................... 257/622 |
| 3,622,382 A | * | 11/1971 | Brack et al. .................. 437/24 |
| 3,648,125 A | | 3/1972 | Peltzer |
| 3,649,386 A | * | 3/1972 | Murphy ...................... 257/626 |
| 3,752,711 A | | 8/1973 | Kooi et al. |
| 3,755,001 A | * | 8/1973 | Kooi et al. .................. 257/622 |
| 3,970,486 A | | 7/1976 | Kooi |
| 4,499,557 A | * | 2/1985 | Holmberg et al. .......... 257/480 |
| 4,916,513 A | * | 4/1990 | Li .............................. 257/510 |
| 5,254,218 A | * | 10/1993 | Roberts et al. ............. 156/662 |
| 5,361,326 A | * | 11/1994 | Aparicio, IV et al. ........ 395/21 |
| 5,696,402 A | * | 12/1997 | Li .............................. 257/510 |

OTHER PUBLICATIONS

Appeal No 223–55 Sep. 30, 1975 Board of Appeals.

Appel No 456–32 Aug., 1981 Board of Appeals.

U.S. Appl. No. 08/483,938, filed Jun. 7, 1995, Li.

U.S. Appl. No. 08/483,937, filed Jun. 7, 1995, Li.

"Integrated Circuits Design Principles And Fabrication," McGraw–Hill Book Co. Inc., 1965, pp. 129–131; 145–150; 174–185—Fig. 5–4(a), p. 131); Fig. 5–23, p. 146; Fig. 5–25–5–27, pp. 147–148; Fig. 7–1, p. 175; Fig. 7–2, p. 176; Fig. 7–6(a), p. 179.

"New Isolation Method Shrinks Bipolar ICs," Electronics, McGraw–Hill, Mar. 1, 1971, pp. 52–55, Fig. 5–6, p. 55.

"Diffusion Depths In Silicon Measured Using Cylindrical Grooves," The American Physical Society Abstracts from the Epitome Of The 1956 Monterey Meeting, Session H, Nov. 1956.

McDonald, et al., "Measurement of the Depth of Diffused Layers In Silicon By The Grooving Method," Journal of the Electrochemical Society, vol. 109, No. 2, Feb. 1962, pp. 141–144—see Fig. 2 and p. 143.

* cited by examiner

SOLID-STATE DEVICE

CROSS-REFERENCE TO RELATED APPLICATIONS

This is a continuation-in-part (CIP) of my applications Ser. Nos. 07/809,460 and 07/816,626, filed Dec. 31, 1991 and Dec. 9, 1991 both abandoned. Both of these applications are CIP's of my application Ser. No. 07/438,692, filed Nov. 17, 1989, now U.S. Pat. No. 5,082,793. The '692 application is a -continuation of application Ser. No. 05/386,102 filed on Aug. 6, 1973 and now U.S. Pat. No. 4,946,800 and a continuation-in-part of application Ser. No. 838,758 and a continuation-in-part of application Ser. No. 05/838,758 filed on Oct. 3, 1977 and now U.S. Pat. No. 4,916,513. These '102 and '758 applications are CIPs of my application Ser. No. 05/154,300, filed Jun. 18, 1971, now abandoned. This '300 application is a CIP of my patent application Ser. No. 04/761,646, filed Sep. 23, 1968, now U.S. Pat. No. 3,585, 714. The '646 application in turn is a CIP of my application Ser. No. 04/490,955, filed Sep. 28, 1965 and now U.S. Pat. No. 3,430,109. I hereby incorporate each of said patents and patent applications by reference into this application. Also related are copending application Ser. No. 08/340,793 filed Nov. 15, 1994 as a continuation of said application Ser. No. 07/809,460, application Ser. No. 08/446,423 filed May 22, 1995 (Patent No. 5,696,402), and copending applications Ser. Nos. 08/483,937 and 08/483,938 filed Jun. 7, 1995, each of the latter three being CIP's of this application Ser. No 08/313,350.

BACKGROUND OF THE INVENTION

This invention is in the field of improved integrated circuit structures and specifically in the field of miniaturized dielectrically isolated integrated circuit structures.

Solid-state devices in general and semiconductor devices in particular must have exacting surface properties for successful operations. These devices therefore often fail by surface or stress-related failure mechanisms. The surface of a PN, $P^+N$, $P^-N$, $PN^+$, $PN^-$, PI, NI, metal-oxide, metal-semiconductor, oxide-semiconductor, interfacial rectifying barrier region, heterojunction between different semiconductor materials such as Si on SiC or diamond, or other optoelectromagnetically active signal-translating region (including several coacting, closely spaced rectifying barriers) is especially sensitive to the ambient or contacting materials, contaminants, impurities, or submicron floating or rubbing dust particles. While not limited thereto, the invention is herein mostly described as examples applied to semiconductor devices each having a PN junction as its optoelectromagnetically active region.

The U.S. Pat. No. 3,585,714 describes new methods for simultaneously achieving device isolation, mismatched composite materials shaping to withstand severe thermal mismatch or chemical reaction induced stresses, junction surface passivation, novel differential expansion of the junction region peripheral surface, physical or optoelectromagnetical exposure of material hidden underneath the junction, high-density integrated circuits witch round-bottomed, intersecting and isolating grooves, and/or greatly expanded peripheral surface for optoelectrical communication or for the otherwise difficult or impossible yet large (relative to the narrow junction width) electrical contacts. Many advantages are thus obtained including: enhanced device reliability particularly during thermomechanical cyclings or in-situ compound formations; increased yield; decreased cost; improved junction region surface passivation; complete device isolation; increased packing density in integrated circuits; increased switching speed; reduced nose, instability, leakage current, and electrical shorts; improved breakdown voltage or other device characteristics; controlled carriers generation, movement, and recombination at or near the junction region peripheral surface; and regulated optoelectromagnetic interaction of the active region with the ambient or contacting material.

The same U.S. patent describes fully the techniques of selective precision material removal by special chemical etching, mechanical polishing with real-time feed-back, or particles bombarding means to achieve microscopically precisely (micron accuracy), differentially expanded junction region peripheral surface of microscopically precise (micron accuracy) shape, size, and location. Such a surface is, furthermore, resistant to surface stress, mobile ions, floating dust particles, and even micron-size rubbing contaminants and, hence, greatly reduces surface failures of the device due to surface microcracks, or micron or submicron dust particles in the environment.

However, such an expanded peripheral surface, being bare, is still not perfectly passivated. Surface layers of inert materials must, therefore, be applied or added onto the differentially expanded peripheral surface for added protection. The same patent also teaches the in-situ formation techniques of the isolating grooves made by thermal oxidation or nitridation.

Unfortunately, these surface layers are far from being perfect or even inert, but are often full of pinholes, microcracks, and other defects. In addition, as pointed out in the '714 patent, these layers must, at the same time, be both thick (but non-flaking) for good protection and yet thin (but non-cracking) for reduced mismatch stresses. They must also be permanently, chemically, and continuously yet firmly bonded to the underlying solid-state materials. These surface layers cannot, therefore, always or in all respects, be inert or neutral. These layers may, for example, be chemically active by introducing contaminants, diffusants, unwanted impurities, or chemical reactants. They may also be physically active by creating intolerable mismatch stresses and strains, microcracks, dislocations, or other physical defects in the solid state device. These layers may even be electrically active by providing unwanted dopants, carrier traps, barrier regions, shorting paths, or inductively-coupled and capacitively-coupled surface streaks or films.

SUMMARY OF THE INVENTION

Therefore, to overcome the foregoing and other difficulties, the general object of this invention is to provide an improved, surface-passivated solid state device having very small geometries, with improved device reliability, mechanically, chemically, and electrically;

A second object of the invention is to provide the peripheral surface of its PN junction region uniquely buried in and surrounded by discretely spaced-apart, inert material regions and not just thin (typically 4,000 A), continuous surface layers.

It is another object of the invention to provide a semiconductor device with an expanded, or differentially expanded, junction region peripheral surface similarly buried in, and surrounded by, metallurgically continuous inert material layers or regions.

Yet another object is to provide a semiconductor device with an enclosing isolation oxide region having a unique, microscopically precise geometry, size, and position relative to the PN junction so as to achieve novel effects."

A further object is to form high-density, high-yield, but low-cost silicon integrated circuits with dielectrically isolated circuit components.

Another object of the invention is provide dielectrically isolated integrated circuits with in-situ formed, chemically formed or ion-implanted oxide or nitride isolating grooves.

Still another object is to provide methods for low-cost, high-volume production of these new miniaturized solid-state devices.

Various other objects and advantages, and a more complete understanding of the invention, will become apparent to those skilled in the art from the following description and claims, taken in conjunction with the accompanying drawing.

DESCRIPTION OF THE DRAWING

For the purpose of illustrating the invention, there is shown in the drawing the forms which are particularly preferred. It is understood, however, that this invention is not necessarily limited to the precise arrangements and instrumentalities here shown but, instead, may combine the same described embodiments or their equivalents in various forms.

DESCRIPTION OF THE PREFERRED EMBODIMENTS

Figure 1:
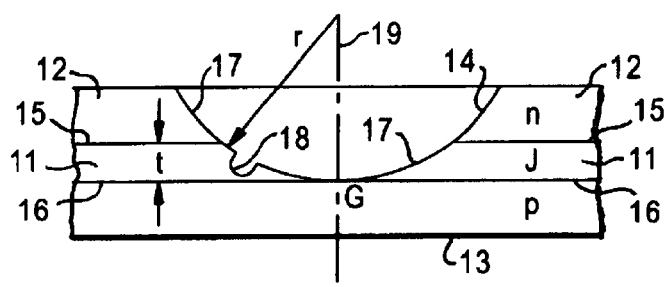
FIG. 1 is a partial cross-section of a semiconductor device having therein a wrap-around or curved-around, junction region peripheral surface and an isolation groove filed with nitrogen, vacuum, air, or other ambient.
Figure 2:
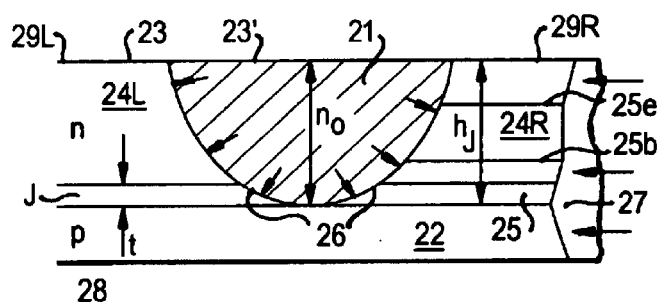
FIG. 2 shows a portion of a silicon structure having a partly buried, PN junction region peripheral surface in contact with a round-bottomed, discretely in-situ formed silicon dioxide (and/or nitride) material region.

The PN junction devices of FIGS. 1–2 are sufficiently disclosed in all the referenced patents and patent applications. The '300 application, for example, specifically indicates that the pn junction devices of FIGS. 1–2 are sufficiently disclosed in my issued patent, U.S. Pat. No. 3,585,714. These are being redescribed (briefly) herein.

In the devices of FIGS. 1 and 2, the electrical signal current through the interfacial electronic barrier, such as a PN junction, is controlled by mobile carriers in the form of electrons and/or holes. The electronic barrier changes its electrically conductivity depending on the applied bias thereacross. For example, the PN junction is substantially electrically nonconductive under an applied reverse bias, but conductive under applied forward bias. This PN junction is a critical component in the functioning of many solid-state devices to be described herein.

Other than PN junctions, metal-semiconductor or Schottky barriers, heterojunctions (e.g., Si, SiC, GaAs, or diamond), metal-oxide, and other electrically rectifying or non-rectifying barriers can also use this invention for, for example, minimize stress-induced damages in the device.

With reference to FIG. 1, there is shown a single-crystalline, device wafer comprising a PN junction (transition, or depletion) region 11 of appreciable thickness, t, formed between a p-type, silicon substrate 13 (body 2 and solid material 2) and an n-type doped, epitaxial silicon layer 12 (body 1 and material 1) grown thereon. That the junction region 11 has finite thickness is shown by, e.g., *Transistor Engineering* by A. B. Phillips, McGraw Hill Co., N.Y., 1962, pp. 111 and 115. A cylindrical groove 14 of radius r has a rounded bottom terminating at point G, and is formed into and past the junction region 11, defined by its upper and lower end or boundary planes, 15 and 16, respectively. The groove 14 has a rounded bottom downwardly terminating at point G. The layer 12 has a top surface (surface 1 or Si), a side surface (surface 3 or S3), and a bottom surface (surface 2 or S2) spaced from the top surface in the vertical direction (D1). The bottom p-type substrate has a top surface (surface 4 or S4) which adjoins surface 2. The groove has a inner peripheral surface which adjoins surface 3 and extends away therefrom in a second direction (direction 2 or D2) transverse to the first direction. The groove may be an air groove, as in FIG. 1; or may be at least partly filled at the bottom with a third solid material 21 (solid material 3), as in FIG. 2).

The peripheral surface 17 of the junction region 11 is distinctly curved and curved-around. The curvature is readily visible to the naked eye without any magnification, and intentionally designed and produced. This is unlike the infinitesimal, unintentional curvature at the central flat portions of the diffused oxide groove on the devices before the mid-1960's. The surface has two opposing sides each containing more than one distinct slopes across the thickness direction. When the groove has a curved or round bottom, which is symmetrical with respect to the bisecting longitudinal plane 19 such as is shown in FIG. 1, the peripheral surface expansion is infinite at the lowest point G, but decreases gradually, and equally on both sides thereof, toward the transversely-expanding, higher level positions.

The groove 14 in FIG. 1 also contains a smaller groove or subgroove 18 therein on its left side. The radius of curvature of the subgroove 18 is about an order of magnitude smaller than that of the main groove 17. In FIG. 1, this subgroove is completely within the 1-micron junction region. Hence, two points on the subgroove are within one micron from each other and from an intersection of the PN junction with the groove bottom.

FIGS. 1 and 2 show a silicon circuit having a continuously curved, cylindrical bottom having zero bottom width and a cylindrical radius of curvature. The oxide groove 21 in FIG. 2 has an oxide surface 23' which is substantially coplanar with the first surface 23 of the top material layer 24L, at least adjacent an intersection of the surface 23 and the boundary between the oxide region 21 and material layer 24L.

The groove 14 has a bottom of zero width, achieving the ultimate in miniaturization for a given device feature size and the unavoidable corners rounding due to diffusion or other processing. The central flat portions of the groove bottoms, present in prior art devices, unnecessarily occupy precious chip real estate and, in grooves filled with solid matters (FIG. 2) generate harmful stresses and related problems such as microcrack formation and carrier mobility control, as discussed in my prior patents and application.

The first part of this specification already shows that chemical, mechanical, and electrical defects on the device are often very closely related. Mechanical stress from device processing or handling can produce microcracks which can cause electrical shorts or opens, through material breakage or contaminant leakage paths in the microcracks. Chemical reactions, particularly during in-situ oxide formation, induces severe stresses. Operation of the device generates heat and causes thermal mismatch stresses. An improper design or processing of the isolating groove can generate excessive stresses leading to electrical device failures.

In accordance with the invention, the grooves have uses including: (1) a microcircuit structure (FIGS. 6–7); (2) junction surface passivation; (3) very large or nearly infinite surface-expansion; (4) electrical contacting (e.g., at points Y, W, Y', and W' in '714: FIG. 7 '800 and '460: FIG. 8); (5) semiconductor-ambient interaction, carrier injection, surface cooling (e.g., FIG. 5 of '300, '800 and '460); (6) new translation of optical and radiation signals at designed minute junction surface at critical locations, spots, or selected points, lines or regions; (7) relief of mismatch stresses and strains; and (8) wafer bonding onto highly mismatched substrate.

The selection of the proper groove design for each of these applications, depends on the object of the grooving (e.,g., large surface expansion for electrical contacting or smaller surface expansion for device miniaturization. The groove selection also depends on several design factors or parameters. The degree of surface expansion in grooving depends on the diameter D of the grooving cylinder and maximum depth h of the grooved surface. These parameters D (=2r) and (groove bottom position) h can be changed at will to meet special demands.

Specifically, Li's prior patents further disclose that dependent on the device design, use, and manufacturing procedures, and materials of construction such as oxide, nitride, glass, organics, one may put more emphasis on reducing type I or II contaminants, or on achieving special effects (such as device miniaturization); and thus select the best surface contour and optimum combination of r and $h_m$ (defined below). For maximum surface expansion, one should use as large a radius of curvature r and make $h_m$ as close to zero as possible, giving maximum protection against type I but much less protection against type II contaminants. On the other hand, if type II contamination problem is very serious, or if hundreds of closely-spaced circuit elements must be isolated from one another on a single 2-cm wafer in microcircuitry work, r must necessarily be small, thereby providing less protection against type I contaminants.

Since the present invention deals with close-packed, miniaturized dielectrically isolated solid state device with small groove radius in small chips, r must necessarily be small, down to about 1 micron according to the Table below. That is, the groove width must be less than D=2 microns (i.e., r =1 micron).

To guide in the groove design, a table is given below. The table, identical to the table in both the '109 and the '714 patents, gives the total surface expansions for different combinations of the cylindrical groove radius, r, and the position, $h_m$, of the groove bottom, G, below the lower junction plane, a+16 (FIG. 1). A positive position, +$h_m$, indicates that the groove bottom, G, is below plane a+16. A negative, position, −$h_m$, indicates that the groove bottom. G, is above the a+16 plane. When $h_m$=0 indicates that G is in the a+16 plane.

The heading in the first column gives the values of different positions, $h_m$, while the heading in the first row gives the different grooving radii, r. The smallest radius for miniaturized circuits is $10^{-4}$ cm, given at the rightmost column in all the tables, where $10^{-4}$ cm is 1 micron. The wide ranges of $H_m$ and r values are compatible with the wide scope of the invention and the many products that can be produced with the invention. That is, miniaturized circuits should use a cylindrical groove surface having a radius of curvature, r, of $10^{-4}$ cm or 1 micron, to thereby give e.g. a 2-micron groove width if the depth of a cylindrical groove equals or exceeds the groove radius.

| | | Surface Expansion for Different r and $h_m$, junction 1 um thick | | | | | | |
|---|---|---|---|---|---|---|---|---|
| $h_m$" | ! | r = $10^2$ | 10 | 1.0 | 0.1 | 0.01 | $10^{-3}$ | $10^{-4}$ cm |
| −0.9 | um ! | 448.5 | 141.6 | 44.72 | 14.34 | 4.473 | 1.415 | 0.451 |
| −0.5 | ! | 1.001 | 316.3 | 100.0 | 31.62 | 10.00 | 3.176 | 1.047 |
| −0.1 | ! | 1.343 | 424.3 | 134.2 | 42.43 | 13.43 | 4.275 | 1.471 |
| 0.0 | ! | 1.414 | 447.2 | 141.4 | 44.73 | 14.15 | 4.510 | 1.571 |
| 0.1 | ! | 1.035 | 327.6 | 103.6 | 32.77 | 10.37 | 5.319 | 1.220 |
| 1.0 | ! | 585.9 | 185.2 | 58.58 | 18.53 | 5.880 | 1.925 | — |
| 5.0 | ! | 301.9 | 95.45 | 30.19 | 9.558 | 3.061 | 1.121 | — |
| 20.0 | ! | 156.2 | 49.39 | 15.63 | 4.965 | 1.649 | — | — |

This table shows for r=1 cm and junction thickness t=1 micron, the integrated junction (peripheral) surface expansion is 103.6, 58.6, and 30.2. Hence, the disclosures in '300, '800, '793, and '460 for this surface expansion of 30, and 100 times shows that the groove bottom is respectively 5.0 and 0.1 microns below the lower junction plane, respectively. Also, for the peripheral surface expansion to beg infinite and to achieve the maximum value, the cylindrical groove bottom point G must coincide with the lower end plane 16, as taught in the '714 and '109 patents. In this case, the equivalent bevel angle theta must therefore be zero, since sin 0°=0 and csc 0° is infinity.

A large grooving radius, while giving a large expanded area suitable for electrical contacting, also simultaneously occupies a large real-estate on the chip. Device miniaturization is then affected. Since this invention applies to at least several types of unique devices, the whole range of the table is useful and must be used. Each combination of h, and r gives the best design for a particular applications.

For example, large junction surface expansion permits electrical contacting or other communication, efficient surface cooling, other surface energy transmission, and protection against Type I contaminants. These applications suggest a large r, such as 1 cm or more.

As shown in the table given above and also in the '109 and '714 patents, the bottom G of the groove 14 may be within a few microns (even one or ½-microns) below the lower end plane 16 of the PN junction region 11. The groove bottom G may lie directly at the lower junction plane 16. An elongated (cylindrical) groove 14 may be parallel to the same junction plane 16 and have its bottom line at G coinciding therewith ($h_m=0$), to achieve locally infinite surface expansion even with a small grooving radius r. The groove 14 may be purposely tilted relative thereto so that the same groove may be above the junction plane 16 at some places, substantially coincide therewith at another place, but lie below the same plane at other places, as disclosed in the patents.

While a linearly or curvedly sloping surface on the device peripheral surface is useful to achieve surface expansion of the junction region, a U-shaped or V-shaped, turn-around, or wrap-around peripheral surface is necessary to allow high-density packing in integrated circuits. Such U-shaped or V-shaped peripheral surfaces also form the all-important gas or solid dielectric isolating grooves. The geometry, size, material composition, formative conditions, and position (relative to the PN junction) of these grooves are very critical and will be more fully described in this specification.

The isolating groove can be formed by, precisely removing material from at least a selected area of the surface 23 of material layer 24L in FIG. 2. Possible precision material removal processes include:

1) precision grinding or polishing with real-time feedback control, as described in the '109 patent, column 2, lines 38–63.

2) precision chemical etching, using repeated masked chemical etchings immediately after precooling or refrigeration limit localized, preferential deep etching at, e.g., dislocations and subgrain boundaries.

3) energetic particles bombarding with aligned or focussed ion, electron, proton, laser, or other energetic particles beam to locally and intensely heat up or energize the intercepting surface atoms to the point of evaporation or ejection. Laser beams can be controlled by simple, stable optics while electron beams by electrostatic deflecting means. Further, these energetic beams not only take off material but also supply the necessary thermal or optoelectromagnetic signals to the device whose response thereto may be monitored to measure or regulate the process of the material-removal operation via real-time feedback control. Laser and electron beams thus have sufficient resolution or accuracy to practice this invention.

These energetic beam processing methods are particularly suitable for forming tiny holes, slots, or other grooves of less than one or 2-microns width with high precision and aspect (depth/width) ratios of 3 or 5 and up.

The device of FIG. 2 is made by selectively thermally growing an oxide groove, band, or solid material region 21 of depth $h_o$ transversely into a single-crystalline p-type silicon substrate 22. In FIG. 2, this oxide groove has a planar surface which is coplanar with the top surface 23 of the n-type diffused layer to facilitate metal contacting. This is followed by in-diffusion of n-type dopants from the top surface 23. The diffusion is guided by the peripheral surface of the inert oxide region and is self-aligning. Hence, the masking step is non-critical. Further, the lateral area of the resultant PN junction is microscopically precisely determined by the groove shape, size, and location. The diffusion gives a (top) doped, n-type epitaxial silicon layer 24, and a new PN junction region 25 of thickness t. The groove bottom is usually completely below the PN junction for device isolation.

The PN junction 25 may be formed prior to or during the oxidation step. The differentially expanded, junction region peripheral surface 26 is surrounded by the inert oxide material region 21. Together with the isolating PN junction 25, this oxide region electrically isolates the two sides of the device. These two sides can, therefore, be used as two independent, electrically isolated but physically integral diodes. Each of the two diodes comprises a top n-type, epitaxial layer 24, a bottom p-type substrate 22 and a PN junction region 25 therebetween. This PN junction 25 thus extends both in the common substrate or buried layer 22 and the top layer 24. These diodes share the same p-type substrate, which electrically connects the silicon pockets 24L and 24R. They are, therefore, physically integral or non-independent; but electrically independently operable diodes as to the biasing voltage applied to, and the signal translation in, the respective PN junctions 25.

For example, while the left 24L/22 diode may be forward biased through suitable contacts 29L and 28, the right 24R/22 diode may be forward biased also (through contacts 29R and 28) but at a completely different voltage, may be zero-biased, or may even be reverse-biased. Two diodes of the integrated circuit of FIGS. 1 and 2 are isolated and independent. This is made possible by the gas-filled or solid oxide-filed groove (14 or 21) at the side thereof and the isolating PN junction (11 or 25) thereunder.

Dopant diffusion or introduction, electrical contacting, and controlled epitaxial layer growth are well known in the semiconductor art. Additional PN junctions 25 band 25e, may be formed in the device of FIG. 2 (See also FIGS. 4 and 8), and the various layers suitable connected to form completely isolated diodes, transistors, tetrodes, Thermal oxidation of silicon with $Si_3N_4$ masks was well known prior to the '714 filing date of Sep. 23, 1968. But the '714 patent discloses a "three-dimensional diffusion" method to achieve a new degree of flexibility in dimensional and configuration control. For example, narrow but deep holes, slots, or other grooves may be formed first, and foreign atoms such as oxygen or nitrogen is then introduced by deposition or ion implantation, at selected locations. Internal point, line, surface or massive types of three-dimensional diffusion sources of these foreign atoms then obtain. New groove configurations and shape controls or other results area then possible.

Alternately, narrow but deep holes or slots or other grooves may be formed and oxygen or nitrogen is then introduced through the newly formed groove surfaces using the three-dimensional diffusion or material introduction technique. Empty grooves may also be filled by chemical vapor deposition for example, precision mechanical polishing at Hence, these grooves are formed to a high precision even minute junction surface on a microscopic scale.

The precisely formed groove can be filled with thermally formed, vapor-deposited, or other oxide, nitride, glass, organics or other insulating material layer on the newly-exposed (groove) surface. The thermal forming and vapor deposition are done in a controlled manner, rather than by natural and incidental oxidation of a silicon surface newly exposed to the ambient.

As described in the '714 patent and the '300 application, in-situ formation of the grooves, without first grooving or silicon material removal, can be done by: 1) ion or proton implantation and 2) thermal oxidation with oxygen or nitrogen. Thermal oxidation with oxygen through $Si_3N_4$ masks was well known prior to the '714 filing date of Sep. 23, 1968. But the '714 patent discloses a "three-dimensional diffusion" method and diffused shape and size control by first forming the microscopically precise groove followed by diffusion through the newly exposed surface formed by the grooving, thereby achieving microscopically precise three-dimensional control as to shape, size, and position of the isolation groove.

The groove may also be formed by material removal to form the depression followed by material deposition such as by chemical vapor deposition. The vapor deposition is performed in a controlled manner, rather than by natural and incidental oxidation of a silicon surface newly exposed to the ambient.

As an alternative to thermal oxidation or nitridation, oxygen and nitrogen may be introduced into the surface 23' by ion or proton implantation or thermal diffusion. Under an implanting voltage of one megavolt, oxygen and nitrogen ions can be introduced into silicon host to a depth of 1.7+/−0.13 um and 1.87+/−0.12 um, respectively. Ion implantation is taught, for example, in U.S. Pat. Nos. 2,787,564; 3,434,894; 3,341,754; 3,326,176; and 3,563,809, respectively of Shockley, Gale, Kellett et al, Sibley, and Wilson. Shockley in October 1954 taught that use of mass spectroscopy separates ions of different masses to generate mono-energetic ion beams for uniform penetration, that by varying the accelerating potential variations in the depth of penetration may be achieved, that by using a suitable apertured mask, moving the wafer, or sweeping the ion beam with a deflection system intermediate between the cathode and the work predetermined geometry of the implanted region is possible, and that ion implanted semiconductor can be annealed at relatively low temperatures (compared to thermal diffusion) to stabilize and repair radiation damage in the newly formed interior zone without appreciable thermal migration of the implanted atoms.

Gale taught the use of magnetic ion optical system to deflect and focus the ion beam, and to achieve a reduction of 100:1 so that a mask aperture of 100 micron square aperture gives 1 micron square at the substrate and 1 micron wide tracks can be achieved, and that no mask is needed. Kellett et al taught that ion penetrates straight into the material into the desired depth and does not diffuse in the body of the silicon after implantation, the boundaries of the implanted region are relatively sharp. In particular, the edge of the implanted region may be controlled with great accuracy down to some few hundred atomic layers. The sharp boundaries results from the annealing of irradiated regions at typically 400–800° C. for 10 minutes, which gives a oxygen (or nitrogen) diffusion length at least two or three orders of magnitude smaller than that due to the common thermal oxidation above 1,000° C. for two hours.

Sibley used computer programmed control on the deflecting means to "write" with a collimated ion beam of selected mass to produce a predetermined integrated circuit pattern on the workpiece. Wilson taught the implantation of oxygen or nitrogen to form electrically insulating and protective films of silicon dioxide or silicon nitride thereon, without masking, wet chemistry, and photolithography.

The width of the groove when ion implantation is used can be less than a micron using a relative movement between the implanting beam and the silicon material, with corresponding adjustment of beam characteristics such as beam energy, current, profile, and focusing, so as to achieve the precise groove shape and chemical composition.

Additionally, Gibbons, J. F. in "Ion Implantation" in Semiconductor Part I Range Distribution Theory and Experiments, Proc. of IEEE March 1968, pp. 295–319 teach in detail the method of introducing precise amount of impurities, such as oxygen, to achieve exact three-dimensional control in shape, size, location, and chemical composition by modulating the energy, current, duration, and position of the ion beam, and the use of apertured masks, moving wafers, and ion deflection or separation systems. Other disclosures of ion implantation techniques known prior to 1971 include: Burrill, J. T. et al in "Ion Implantation as a Production Technique,". IEEE Trans. on Electron Devices, Vol. ED. 14, No. 1, January 1967, pp 10–17; Buchanan, B. et al in "High-Energy (1 to 2.5 Mev) Ion Implantation for Obtaining Novel Semiconductor Junction Structure," International Conference on Applications of Ion Beams to Semiconductor Technology, Grenoble, 1967, pp 649–668; and Blamiers, N. G. in "A Preliminary Study of Semiconductor Structures Produced by Ion Implantation," given at the same International Conference on pp 669–684. These scientists and engineers taught that through control of beam size and aiming point by, e.g., aligning, focusing, and aligning and focusing, ion implantation can control the dimension, shape, and three-dimensional chemical compositions to submicron accuracies. Also argon ion beams can serve as a precision material removal tool.

Hence, ion implantation and proton implantation, accurate even to Angstroms, were well developed prior to 1971 and can be even more precise in depth and lateral dimensions, down to Angstroms in sizes and accuracies. The 154,300 application, filed Jun. 18, 1971 shows at page 6, lines 13–15 shows that under an implanting voltage of one megavolt, oxygen and nitrogen ions can be implanted into silicon host to a depth of 1.7+/−0.13 microns and 1.87+/−0.12 microns, respectively. That is, the vertical or depth resolution is of about 0.13 microns, or 1300 Angstroms. Page 14, line 26 to page 15, line 4 of the '460 application shows that The width of the groove when ion implantation is used can be from about a micron up, using a relative movement between the implanting beam and the silicon material, with corresponding adjustment of beam characteristics such as beam energy, current, profile, and focusing, as taught in the prior art cited above.

The distinguishing features of ion or proton implantation relative to the other methods of introducing foreign atom into semiconductors including thermal diffusion or melt alloying are as follows. Ion implantation: (1) penetrates straight without appreciable lateral diffusion to give orders of magnitude sharper boundaries; (2) achieves controlled size of the implantation region down to less than 1 micron, with an accuracy of 1,000 or 1,500 Angstroms (0.10–0.15 micron); (3) can be done without masking, wet chemistry, and photolithography; (4) if mask is used, the implanted size can be reduced by one order of magnitude (10 times) from the mask aperture size; (5) the implanted region need not start at the surface of contact with the foreign matter; (6) The foreign atom concentration profile need not be limited to the exponential or error function complement (erfc) types for thermal or alloy diffusion cases; (7) argon ion beams may be used to p-precisely remove materials from semiconductor surfaces; and (8) can control the shape and three-dimensional chemical compositions to submicron accuracies.

To be electrically isolating, the groove 21 need not be completely filled with oxide or nitride. Only a peripheral ring where the groove surface intersects the PN junction is the insulating material required, with the rest of the groove region filled with any solid material including oxide, glass, organics, semiconductor, metal, or intermetallics. Conductive metal, intermetallics, or organics may even serve as contact to the p-type substrate. The metal, intermetallics, semiconductor, oxide or other insulator may be one or more orders of magnitude more electrically more conductive than the next material in the above sequence. Because of the accuracy of ion surface or bulk implantation, the oxide peripheral insulating ring, and the metal or intermetallic contact core may both be implanted. Even the inside surface of the groove may be implanted with oxide or nitride. Implantation of other foreign atoms at selected locations inside the isolating groove may also be desirable, to thereby form an even more complex composite isolating groove. Alternatively, the same composite groove may be formed by other well-established methods such as chemical vapor deposition.

The groove 14 has a cylindrical, wrap or turn-around bottom of zero width, achieving the ultimate in miniaturization for any device feature size. This is because the central flat portions of the groove bottoms, present in prior art devices, no longer exist to occupy precious chip real estate. In grooves filled with solid matters (FIG. 2) excessive, harmfully mismatch stresses and related problems such as carrier mobility control are thereby minimized or eliminated.

The device of FIG. 2 is not a complete device as shown by the curved, cut-out lines on both the left and right sides thereof. A complete device would be similar to the integrated circuit shown in FIGS. 6 and 7 (See also FIGS. 5 and 6 in the '109 and '714 patents). In these integrated circuits, the gas, vacuum, or solid dielectrically insulating, close-ended (or annular) grooves provide a plurality of electrically isolated silicon pockets or islands for the electrically independently operable diodes, transistors, or other active or passive components such as resistors, capacitors, and inductances.

For example, thermally growing $SiO_2$ (silicon dioxide) downwardly or transversely into selected area of a silicon substrate is possible with the usual masking techniques. Diffusion through masked areas is well-developed. Thus, silicon can readily be chemically plated or vacuum deposited with layers of platinum, rhodium, gold, nickel, other metals, or even some nonmetals such as $Si_3N_4$ or SiC. These layers are oxidation-inhibiting for the silicon thereunder, but may be made even more so by other oxidation-preventing surface layers electrolytically plated or otherwise built thereon. Windows may then be opened by mechanical, chemical, theremovacuum, or photoengraving means through these oxidation-inhibiting layers, for oxygen in-diffusion at selected areas.

V. Y. Doo in "Silicon Nitride, A New Diffusion Mask," IEEE Transactions on Electron Devices, Vol. 13, No. 7, 1966, pp. 561–563; and J. A. Apels et al in "Local Oxidation of Silicon and Its Applications in Semiconductor Device Technology," in Philips Research Reports 25, page 118, 1970 have described a successful silicon nitride masking technique for diffusion into silicon of oxygen, boron, gallium, phosphorous, and arsenic. Doo, for example, shows that $Si_3N_4$ layers 150 to 1200 A thick can be pyrolytically deposited on silicon from silane and ammonia with excess hydrogen at 750 to 1100° C. These layers, after photoengraving, mask the diffusion of B, P, As, Ca, and O. The photoengraving process involves a KMER (Eastman Kodak) photoresist masking layer formed on the $Si_3N_4$ layer. This layer is exposed to ultra-violet light through a mask, and selectively removed at "window" areas by hydrofluoric or phosphoric acids. Foreign atoms of O, B, Ga, P, and As may then thermally diffuse into the silicon through these windows exclusively.

Other related technique on thermal oxidation are discussed by Kennedy, D. P. and Murley, P. C. in "Calculations of impurity Atom Diffusion Through A Narrow Diffusion Mask Opening", IBM Jour. Vol. 10, 1966, pp 6–12 (especially FIGS. 1 and 4); and by Lee, T. P. and Sze, S. M. in "Depletion Layer Capacitance of Cylindrical and Spherical Junctions," Solid State Electronics, Vol. 10, 1967, pp 1105–1108.

In thermal oxidation, one mole of silicon (28.0 g or 12.0 cc) reacts with one mole of oxygen (32.0 g) to form one mole of $SiO_2$ (60.0 g or 25.9 cc). The densities of silicon and $SiO_2$ are 2.34 and 2.32, respectively. The volume ratio of $SiO_2$ to the original silicon is 25.9/12.0=2.16. If unrestricted, the linear expansion of the silicon upon complete, in-situ oxidation to $SiO_2$ is the cubic root of (2.16)–1.00=29.2%. Similarly, the in-situ formation of $Si_3N_4$ from Si also produces a linear expansion of 4.3%, if the density of the nitride is 3.44, as reported. The significant linear and volume expansion during the formation of the entire discrete, oxide (or nitride) region (not layer or coating) from silicon introduces compressive stresses parallel to the PN junction planes 15 and 16, i.e., acrrs tte lateral dimension of the junction and oxide regions. Properly directed, moderate amount of residual compressive stresses, e.g., from the mismatched expansion coefficients strengthen the brittle Si and $SiO_2$, are beneficial for the device to withstand thermomechanical stresses. Excessive stresses can also cause mechanical failures of the device in the form of microcracks or interfacial debonding.

Many types of stresses arise from processing and handling stresses, in-situ formation stresses due to volume expansion of silicon oxide from silicon, and thermal mismatch between the silicon and silicon oxide during thermal cycling in device operation. Because the oxide region in FIG. 2 comprises at the top a free (vacuum-exposed or gas-exposed) surface and a rounded bottom (with no sharp corners), and because of graded seal or gradual (oxygen) concentration effects, these high stresses are spreaded out evenly over wide areas (providing stress relief), thereby avoiding splitting cracks. The resultant device is thus resistant to relative tangential movement (i.e., rubbing contaminations) between the semiconductor silicon and $SiO_2$ at the junction peripheral surface 26, and also to crack formations by mismatch stresses during thermal cycling, such as from repeated, on-off operations of the device.

This is one main reason why thin oxide films are not passivating, because partly due to its thinness, these films easily cracks or blisters, spalls, and debonds under stresses, thereby losing its passivating qualities. In the present invention, the new devices have oxide or nitride isolating groove or regions having typically 4 to 6 orders of magnitude thicker cross-sections (relative to a 5,000 Angstrom thick film) to withstand the stresses. At least the central portions of these isolating grooves have cylindrical bottoms having inverted arch shapes. It is well known that arcs withstand stresses much better than flat shapes, partly because of stress and strain distribution and relief. Hence, the new devices are mechanically more stable and reliable partly because of the invert arch effect.

An oxide region consisting entirely of in-situ formed silicon oxide is advantageous for other reasons. The oxide region is 100% dense, substantially chemically pure and uniform, and non-contaminating. It is also impervious to contaminating gases and mobile ions, being made more so by the residual compressive stresses. This is in sharp contrast to other procedures in which the cut or etched-out grooves in silicon are only superficially oxidized into thin (e.g., 8000 A) $SiO_2$ layers and later filled with such materials as polycrystalline silicon, glasses, oxides, or plastics. Flat oxide layers on silicon, as shown below, have no curvature-related strain-relief mechanisms and are unreliable because of crack formations in the layer through the same mismatch stresses acting harmfully here.

In addition, the common filling materials are almost always impure, particularly when compared to $SiO_2$ formed in-situ. Schwartzman, for example, pointed out in his U.S. Pat. No. 3,383,760, Col. 4, lines 4–6 that most glasses contain impurities that may adversely affect the PN junction. Further, the filled materials are not 100% dense, particularly with narrow grooves in microcircuits (See, e.g., Frouin U.S. Pat. No. 3,520,139, Col. 2, lines 44–46), and do not contribute to the beneficial compressive mismatch stresses. In addition, both the cracked oxide layer and porous filled materials "breathe" to easily contaminate the shallowly located, PN junctions.

In contrast to in-situ formed oxide layers, the discrete or spaced-apart, specially shaped and positioned, oxide regions of this invention lower, through curvature, proximity, and other unique effects, the mismatch stresses. There is also the beneficial compressive stress pattern, but no excessive built-ups of harmful stresses that case crack, split, or microcrack in the device. There are limits between the relative areas occupied by the silicon and silicon oxide regions, and as to the maximum lateral dimension of the oxide region and the minimum separating distance between neighboring oxide regions. As a rule, the relative area ratios of silicon to $SiO_2$ should be between 1/1:1 to 8:1. The maximum lateral dimension is about 10 times the depth of the oxide region; and the minimum separating distance is about ¼ to ¹⁄₁₀ times the width of the groove.

A cylindrical or, in general, rounded groove bottom lessens the splitting forces on the neighboring silicon layer because the-oxide (or nitride) region favorably compressed during the oxide formation step. The groove bottom has a blunt, rather than a sharp tip or bottom (no notch effect). The mismatch stresses between silicon and its attached $SiO_2$ always continuously and nonabruptly vary at rounded bottom (curvature effect). These stresses are smaller on a curved adjoining surface than on a flat adjoining surface (curvature effect on stress pattern). In particular, the stresses are zero or minimal in the lateral direction at the bottom if it has a zero width, and minimal and symmetrically distributed when the rounded bottom is symmetrical with respect to a longitudinal bisecting plane thereof (oxide region geometry effect). Hence, It is highly desirable to locate the PN junction at (to achieve large surface expansion), or within a micron or a few microns of (for proximity effect) the bottom of the round-bottomed oxide region.

A properly shaped, sized, and positioned solid or gas-filled groove, as disclosed in the '714 patent, systematically varies, the transverse or cross-sectional area of the junction region, with the depth or thickness thereof. The laterally extending area of the active region is thereby also accurately defined with microscopic precision.

The junction region 11 of the device of FIG. 1 can be prepared first before the isolating groove 14 is formed into the doped, n-type epitaxial layer 12. The junction region 25 of the device of FIG. 2 can also be prepared prior to, or during the same formation of the oxide-filled groove 21 in the doped, n-type epitaxial layer 24.

A feature of the invention, however, is to form the oxide region 21 first at a high temperature (typically 1000 to 1350° C.) followed by the junction formation. The subsequent, lower-temperature junction-forming step, by, for example, dopant diffusion at 900° C. or ion implantation at even lower temperatures, relieves excessive compressive residual stresses. But some residual, beneficial compressive stresses always remain because of the temperature differences in oxidation and junction formation.

Figure 3A:
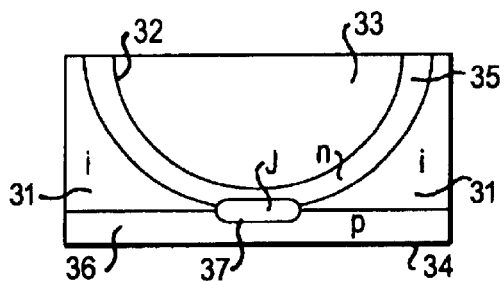
FIGS. 3a and 3b show a semiconductor device having its PN junction region peripheral surfaces completely buried in intrinsic, or electronically inert, semiconductor materials.
Figure 3B:
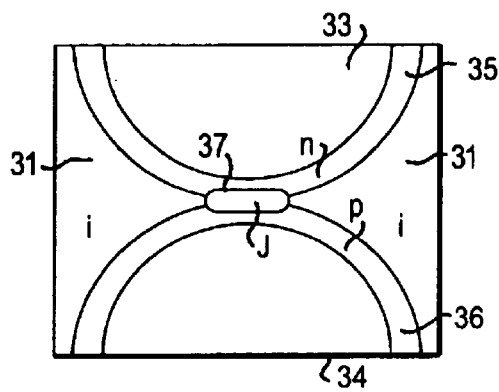

To make the device of FIG. 3, a single groove 32 made into the top surface 33 of a slab of intrinsic semiconductor material 31 (FIG. 3a). The same slab may be alignedly grooved on both the top and bottom surfaces (FIG. 3b). Next, n-type and p-type dopants are diffused in, from the top and bottom surfaces, 32 and 34, respectively. The result is a top n-type layer 35, a bottom p-type epitaxial layer 36, and an intermediate, striped or pan-cake type PN junction region 37. This junction region is well inside the slab and is completely surrounded by and buried in the electronically inert material 31. The same junction region can be planar or curved, depending on the surface concentrations of the n-type and p-type dopants and also on the slab thickness.

Figure 4:
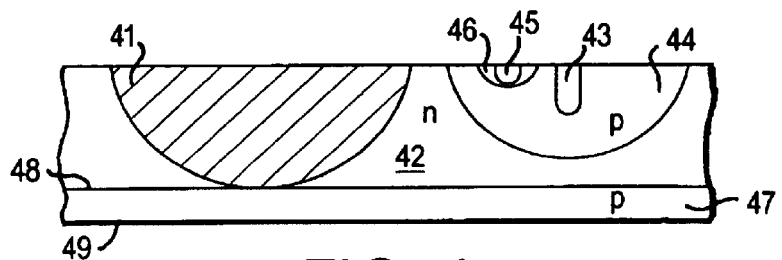
FIG. 4 shows npn transistor structure in a microcircuit made by discretely in-situ formed, oxide and/or nitride isolation region and three-dimensional dopant diffusion.

The device of FIG. 4 is made by forming, in a manner similar to the making of the device of FIG. 2. Here, an oxide, nitride, or other inert material region 41, together with the PN junction between two silicon layers 42 and 47, isolates the two left and right diodes. A hole or slot 43 is then formed to introduce three-dimensional p-type dopant and to form the p-type base region 44, according to the '714 patent. Finally, a shorter hole or slot 45 is made to similarly form the n-type emitter region 46. This completes a new nPN transistor structure in the top n-type layer 42. By controlling the shape, size, and location of the holes, slots, or other depressions, and the type, surface concentration or total amount of dopant or other foreign atoms introduced by diffusion or ion implantation through the newly-formed groove surfaces, other unique diodes, transistors, tetrodes . . . are possible. Oxygen, nitrogen, and other foreign atoms are useful to form the required isolation inert material region or low-resistivity regions underneath an isolation PN junction to connect pockets of the otherwise electrically isolated silicon material. These pockets are separated by the oxide grooves or regions 41.

The npn transistor in FIG. 4 is completely or totally isolated electrically from neighboring npn transistors (not shown), laterally by the oxide region 41 and underneath by the PN isolation junction 48. The silicon pockets and npn transistors are completely isolated from each other. In FIG. 2, the emitter-base and base-collector junctions 25e and 25b of the npn transistor is also electrically isolated from similar npn transistors on the other (e.g., left) side of the oxide region 21.

Similarly, the integrated circuit device of FIG. 2 can be used as a silicon structure of passive resistors 24L, 24R, . . . , only. These resistors are then also completely electrically isolated from each other by the oxide region 21 and the PN isolation junction 25.

The device of FIG. 4 may be made to contain a npn transistor formed by the materials 42-44-43, a pnpn or npnp tetrode formed by materials 49-42-44-43 or 42-44-46-45, respectively. To make these components, a narrow but deep hole 43 or shallow hole 45 must first be formed, followed by three-dimensional diffusion or ion-implantation of the proper dopants through the newly formed grooved surfaces. Both the deep and shallow holes are cylindrical shaped, and have cylindrical bottoms.

Figure 5:
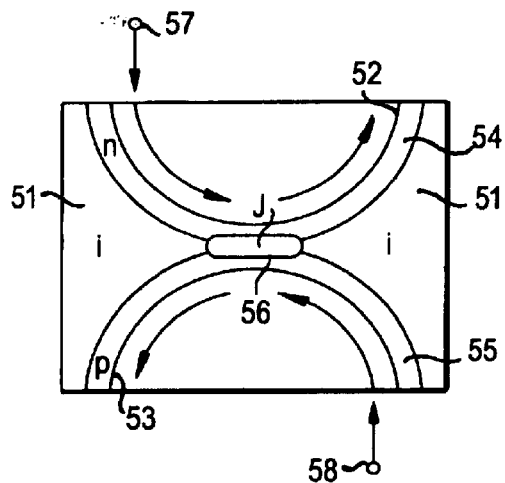
FIG. 5 shows a high-power laser device having its buried, PN junction region peripheral surface differentially expanded for improved cooling results.
Figure 6:
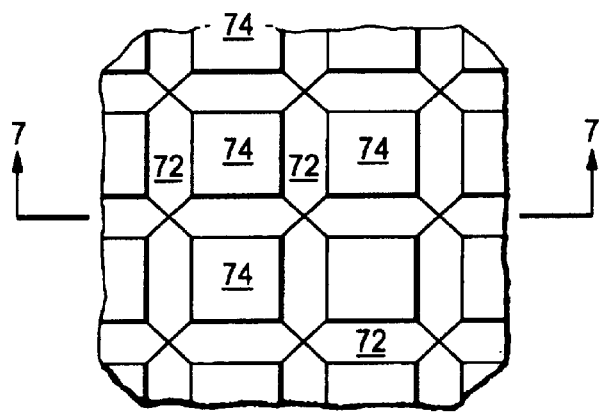
FIG. 6 is a top view of a monolithic microcircuit containing a system of normally intersecting, gas, nitride, or oxide-filled grooves.
Figure 7:
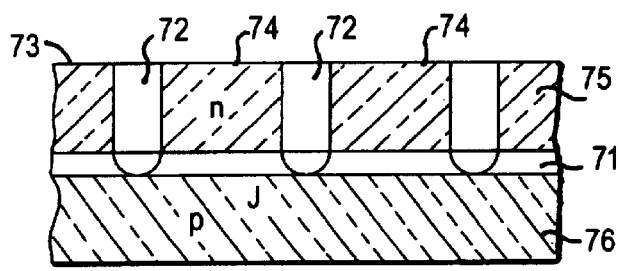
FIG. 7 is a cross-section of the device of FIG. 6, taken along the line 7—7.
Figure 8:
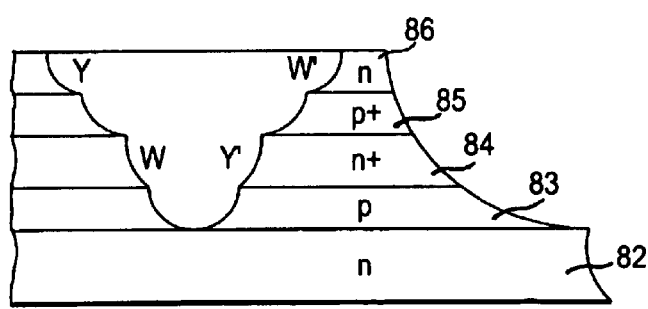
FIG. 8 is a cross-section of a "universal integrated circuit" showing the unique circuit structure.

FIGS. 5–6 of both the '109 and '714 patents, and FIGS. 6–7 of the '793 and '800 patents, and the '460 and this applications all show a piece of a monolithic microcircuitry broken off from a 2 cm×2 cm semiconductor wafer containing, say, 30×30 or 900 individual, isolated circuit elements. The groove radius, r, in these examples must therefore, necessarily, be very small, such as 1 micron, to make the miniaturization possible. Small radius r also provides maximum protection against Type II contaminants during processing.

The high-power laser device of FIG. 5 is made in a manner similar to the making of the device of FIG. 3b. Here, two grooves 52 and 53 are formed into an intrinsic material slab 51. Dopant diffusions are then carried out to form the n-type top region 54 and p-type bottom region 55. These two regions are separated by the buried PN junction region 56. Rapidly moving cooling fluid jets or streams 57 and 58 (such as of air, water, or brine) are introduced tangentially to the grooves, as shown. The high velocity and centrifugal force of the jets or streams insure good thermal contact of the cooling fluid to insure efficient surface cooling. In this device, the light beams travel in directions normal to the figure, being bounded by two optically flat surfaces (not shown) parallel to the drawing paper. One of these two surfaces allows the laser beam to come, e.g., out of the paper. Alternately, the intrinsic material region 51 may be replaced by thermally grown-in silicon dioxide on a silicon substrate. The active regions of the devices of FIG. 3 and 5 are isolated from the ambient-exposed surfaces of the device, where rapid degradation is likely. The solid regions 31 or 51 on either side of the stripe active region are able to carry heat away from the current-carrying active region.

FIG. 6–8 have been described in the '109 and '714 patents. FIG. 6 shows a top view of a piece of a monolithic microcircuitry chip broken off from a, e.g., 6 cm×6 cm. semiconductor wafer containing thousands or more of isolated circuit elements. There are two groups of linear and mutually perpendicular, gas or solid-filled isolating grooves 72. FIG. 7 shows a vertical cross-section of the same microcircuitry piece taken along line 7—7 of FIG. 6. Here, the grooves originate from the top surface 73 and have cylindrical bottoms. The bottoms lie directly in the lower boundary plane 76 of the junction region 71 between the top and bottom layers 75 and 76. Each of the isolated circuit elements located in the individual silicon pockets 74 can operate independently of the others in signal translation. The performance of the signal translation is improved by the unique shape, size, and position of the grooves.

FIG. 8 shows a portion of an integrated circuit which is "universal". The circuit contains a large number of combinations of electrically isolated, active and passive circuit components, such as diodes, triodes, tetrodes, . . . , resistors, and capacitors. Yet the circuit has only five carefully chosen and physically integral, semiconducting layers. These layers, respectively n, $p^+$, n, p, n in conductivity types from the top down, produce all these components. A substrate may contain the bottom one to four layers with the remaining top four to layers epitaxially deposited thereon. These five layers and the gas or oxide filled groove YWY'W' can provide: four pairs of diodes, three pairs of triodes or transistors, two pairs of tetrodes, or a single pair of pentodes.

From suitably connected regions in these same coacting semiconductor layers, many precision resistors, capacitors, electrically conductive paths, and other passive components can be also made. The dimension and operating characteristics of these components are accurately defined laterally by the enclosing, microscopically precise air or oxide grooves, and transversely by the electrically rectifying PN junction. Low resistivity layers may form cross-overs, cross-unders, buried collector layer, . . . , to be suitably connected by diffusion or metal films. The main groove YWY'W' comprises several subgrooves, such as at Y, W, Y', and W'. The bottom of the main groove YWY'W' is within a few microns of most of these layers or PN junction, while the bottoms of most of these subgrooves are within a few microns above some PN junctions but below others.

As usual, the manufacture of these microcircuits containing both active components and passive components involve such repeated processing steps as forming nitride insulating layer; masking and selective nitride (or oxide) removal; etching, grinding or energetic beam bombarding to form microscopically precise grooves into these exposed areas; thermal oxidation or implantation and dopant diffusion into these grooves; masking and selective oxide removal; removal of residual nitride or oxide layer after oxygen or dopant diffusion; forming low-resistivity cross-over or cross-under regions similar to Doo's $P^+$-type region 4 in the p substrate (see , e.g., U.S. Pat. No. 3,386,865); dopant diffusion or ion implantation through oxide window for PN junction formation or electrical contacting to the low-resistivity, buried cross-overs or cross-unders; and electrical contacting through windows in oxide layers covering the device surfaces.

The second and third (from top down) semiconductor layers have superscripts to indicate very heavily doped, p-type and n-type materials, respectively. These superscripts may be "−" to indicate very lightly doped materials. Two more useful combinations of the semiconducting layers thus obtain: $np^-n^-pn$ and $npn^-p^-n$. Low-resistivity $N^+$ and $P^+$-type layers 82 and 83 in the substrate may form buried cross-unders to connect isolated silicon pockets electrically.

According to this invention, oxide or nitride-isolated, monolithic solid-state circuitries having densely-packed, electronically discrete solid-state components are possible by intersecting and triangular, square, or, in general, polygonal or close-ended (or annular), isolation oxide grooves. These grooves, in any possible top widths or configurations and cross-sectional shapes, completely and accurately define the lateral limits of the active region or isolated silicon pockets or islands. These cross-ended grooves are to be referred to as "annular-shaped isolation regions."

To minimize physical damage during mechanical grooving, to facilitate microscopically precise chemical etching or cutting, to maximize device yield, or to obtain other special optoelectrical effects, the directions of the grooves may coincide with crystallographic directions of extreme or maximum atomic density of either the semiconductor substrate 22, or the epitaxial layer 24, or both. The <111> directions on (111) wafers and the <100> directions on (100) wafers of silicon or germanium are, therefore, preferable. Together with the isolating PN junction, such a system of grooves formed on a device wafer may produce many discrete and electrically independently operable, active or passive circuit components.

By preparing a groove, slot, hole, or other depression into the semiconductor layer, and introducing the right amount of dopants or foreign atoms (such as O, N, Ga, B, P, As) at selected locations in the resultant grooves, internal point, line, surface, or massive types of three-dimensional sources of foreign atoms are then obtained, Thermal oxidation or ion/proton implantation may then be applied to achieve exact three-dimensional configuration and/or concentration profile of the diffusing or implanted atoms. Skilled persons can use any of these techniques not only to prepare the emitter, base, and collector regions of transistors (see FIG. 4); but also to form regions of differing conductivity type in the oxide-isolated silicon pockets 24L and 24R; to prepare the conventional, low-resistivity cross-unders or cross-overs located in the substrate 22 directly beneath the epitaxial layer 24 so for interconnecting regions 24L and 24R separated by the oxide isolation regions 21 (FIG. 8); to convert entire oxide-isolated silicon pockets into other low resistivity regions by dopant diffusion for use as cross-under or cross-overs; and the like.

Three-dimensional, configuration or diffusional front control can be combined with the nitride shielding method disclosed above. Take, for example, the integrated circuit device of FIG. 2. Here, a uniform, oxidation inhibiting (or insulating) silicon nitride layer is first laid on the top surface 23 of an n-type silicon layer 24 epitaxially grown on top of a p-type substrate 22. Windows are opened up in this nitride layer, e.g., by selective HF etching. Grooves are then made in the window areas by special chemical etching or energetic particles bombardment. The silicon wafer is then oxygen implanted or thermally oxidized, through the newly exposed surface of the depression to form the oxidized silicon isolation regions 21 extending through the epitaxial layer 24 into the isolation PN junction 25. This procedure subdivides the epitaxial silicon layer 24 into many oxide-enclosed and electrically isolated, pockets of semiconductor silicon material. Any residual nitride layers can easily be removed after their uses by HF or $H_3PO_4$. This procedure provides microscopically accurate oxide regions with planar top surface 23', which is coplanar relative to the silicon layer surface 23.

The device of FIG. 2 contains only a simple, PN junction to exemplify the optoelectromagnetic, signal-translating active region. Other devices may have much more complicated structures. Specifically, the top and/or bottom layers 24 and 22 of FIG. 2 may be replaced by, for example, up to five layers of the device in FIG. 8, and contain not only P and N layers but also P+, N+, $i_p$ (very weakly P-type intrinsic), and $i_n$ (very weakly N-type intrinsic) materials. The P or N materials are widely (by at least several orders of magnitude) different in electrical conductivity and dopant concentrations relative to $P^+$ and $i_p$ or $N^+$ and $i_n$, respectively. These layers may be prepared either before, during, or after the gas or solid-filled isolating grooves are formed, as per conventional semiconductor technology.

The thermally grown-in oxide, ion-implanted oxide or nitride, or the intrinsic material regions of the devices of FIGS. 1–5 are not only electronically inert but also unetched, uncut, and otherwise similarly unmodified. This condition preserves the as-formed, metallurgical continuity. Metallurgical continuity or, even better, metallurgically perfectly and continuously bonded silicon to $SiO_2$, obtained by thermal oxidation or implantations to form grooves of special shapes, reduces or minimizes mismatch stresses partly through the arch and graded-seal effects. "Microscopically perfect bonding" means that the components (i.e., silicon and $SiO_2$) are bonded with a nearly 100% dense, bonding region which is microscopically defect-free, i.e., with no visible microcracks even at 1,000 magnifications. These material regions are completely different in structure, mode of operation, and result from the usual, painted-on organics, fired-on glasses, filled organics, physical or evenchemical depositions. All of these processes give nonperfect bonding regions with many voids and microcracks.

Even the common oxide or nitride surface layers are too thin and too imperfect, and also improperly oriented and positioned relative to the PN junction region, to achieve the results of this invention. Specifically, the conventional, relatively thin and planar oxide surface layer for device junction passivation is, for example, very thin, typically 4000 A. As mentioned above, too thin a layer tends to crack and gives inadequate protection, while too thick a layer often peels or flakes off and causes extensive mismatch shear stresses at the oxide-silicon interfaces.

These harmful stresses arise from several reasons: 1) $SiO_2$ expands, i.e., has a temperature coefficient of thermal expansion of, about $5.0 \times 10^{-7}$ /° C. while silicon expand about ten times as much. A silicon wafer bonded with $SiO_2$ subjected to a single 0 to 80° C. thermal cycle with thus subject the brittle silicon to a mismatch stress of about 10,000 psi.; 2) the oxidation step is usually done at high temperature (up to 1350° C.) in an oxidizing ambient (e.g., steam), so as to allow great build-up of the mismatch stresses during the wide cooling temperature range; 3) the normal stresses at the free (i.e., gas or vacuum exposed) surface of oxide must be zero. There is, therefore, a very steep normal stress gradient across the very thin surface layer; and 4) the geometry of the thin surface layer (see layer 27 in FIG. 2) allows no stresses relief, particularly when the layer is flat. These conditions generally result in pinholes, microcracks, faults, imperfect oxide protection, and loss of device passivation. Further, any oxide defect will immediately expose the underneath silicon to the ambient, again because the surface oxide layer is thin. Modern miniaturized circuits have very shallow PN junctions, and are particularly prone to such failures.

In contrast, in the grown-in oxide region 21 of FIG. 2, the oxidation step is preferably done first when there is no junction region 25 to damage by mismatch stresses. The lower temperature (about 950° C. or lower) junction forming step actually acts as beneficial annealing and stress-relieving operation, thereby minimizing oxide failures. Even if the oxide is so damaged, the deep junction peripheral surface 26 may still not be affected. Also, there is no free or physically exposed surface in the oxide material region 21, except at the top surface 23 which is not as extensive as the oxide surface layer 27.

The top free surface 23' is less than 40% of the total surface of the oxide region 21, in contrast to about 50% for the thin oxide layer 27 in FIG. 2. The free surface of the oxide region is also far away from the deeply buried junction region 25, thereby minimizing the effect of ambient on the deeply located junction 25 through any surface-related defects in the oxide. The oxide groove 21 also terminates at its bottom in the form of a line of zero horizontal width. The horizontal stresses from the mismatches between the oxide and silicon at this bottom must also zero or minimal. Because of its cylindrical bottom and planar symmetry, the same oxide groove is subjected to further reduced mismatch stresses. The microscopically nearby junction region is, therefore, also much less severely stressed than higher points on the oxide-silicon interface. In addition, the generally sloping and/or curved or multiply sloped sides contacting the peripheral surface 26, and/or the close proximity (within one or two microns) of the rounded bottom of the oxide region or groove 21 to the PN junction region 25, further allow more stress and strain reliefs.

When very severely stressed, a solid oxide region (or even thin layer) in a turn-around V or U-shaped groove minimizes oxide cracking and loss of device passivation, if the sensitive PN junction is microscopically close to the exact bottom of the groove. When such a groove has a rounded bottom, a new effect occurs, i.e., inverted arch effect. Solid oxide regions or even thin layers in the rounded bottom has an arch structure that can withstand much greater forces without failure than if the regions or layers are flat. These results further show the critical importance of proper geometry and location of the isolation oxide material.

A flat, thin layer on any mismatched substrate is likely to crack when extended in dimension. Familiar remedies are intentional gaps in railroad tracks or concrete highways. But gaps in passivating layers on semiconductor devices are contaminating and totally intolerable. Also, once a thin oxide layer is cracked or even microcracked, no amount of etching, cutting, grinding, or filling will restore its integrity and imperviousness. Its passivating qualities are thus forever lost or greatly reduced.

The present invention overcomes this mismatch problem in several ways. The oxide is purposed broken up, during its formation period, into small patches. Being proportional to the linear dimension, the mismatch stresses are relatively small and tolerable. The isolated silicon pockets can be considered as gaps in an otherwise continuous oxide structure. Other solutions of the problems such as by proper oxide geometry, location, orientation, formative conditions, . . . , have already been described elsewhere in this application.

In the formation of the convention thin oxide layers, the oxygen atoms diffuse uniformly over the layered portions of the exposed silicon surface, essentially in a single direction normally of the same layer, as shown by the arrows across the layer 27 in FIG. 2. Surface oxidation parallel to the PN junction region thus develops great harmful shear stresses in the direction of the PN junction to increase the chances of shearing and contaminating damage to the PN junction.

In the formation of my oxide region, the oxygen atoms generally diffuse through windows in the $Si_3N_4$ layer, transversely downward as well as sideways. The depression is multi-directional, as shown by arrows in the oxide region 21 of FIG. 2). The oxidation thus proceeds laterally outward in many direction from a transversely extending, moving solid core with no free surface to dissipate stresses, thereby allowing the build-up of beneficial compressive stresses in the lateral directions across the silicon pockets and PN junctions. These compressive stresses minimize shear and contamination, particularly to the nearly PN junction, and are an important feature of the new isolation oxide regions. Even a thin oxide layer (e.g., 0.8 micron) at the bottom of a symmetrical, 20° V-shaped groove (in which the oxide height measures 0.8/sin 10°=4.6 microns) can achieve these beneficial stresses. The thin oxide layers at the V-shaped or U-shaped groove bottoms also achieve the desirable wedging or arching action, minimizing oxide failures. Hence, the PN junction must be critically located, such as at no more than one or two microns above the groove bottom. Also, the oxide so formed must be unetched, uncut, or otherwise similarly undisturbed and unmodified.

Thus, while the thin surface oxide layer 27 of FIG. 2 has the improper geometry, position, orientation, and formative conditions to allow adequate stress and strain relief on the peripheral surface of the PN junction region, the properly formed, shaped, sized, positioned, and oriented oxide region 21 of the same figure achieves improved stressing and straining patterns and beneficial compressive stress on the same peripheral surface, thereby improving device surface passivation and stabilization. Hence, the transversely extending, oxide region 21 differs from the thin surface layer of even the same metallurgically continuous oxide or nitride coatings normally used for some surface protection.

The invention, as described above, is not to be construed as limited to the particular forms disclosed herein, since these are to be regarded as illustrative rather than restrictive. For example, Ge, GaAs, Gap, InP, InSb, SiC, diamond, and other III-V or II-VI compounds, may, e.g., replace Si. Other useful materials include various semiconducting compounds consisting essentially of at least two elements respectively selected from at least two different groups of the periodic table. Further, various combinations, equivalent substitutions, or other modifications of the preferred embodiments described herein are obviously possible in light of the description, without departing form the spirit of the invention. Accordingly, the invention is to be limited only by the scope of the appended claims:

I claim:

1. A solid state circuit device comprising:
    a solid state material substrate of one conductivity type having a first surface;
    a solid state material body of opposite conductivity type placed on a selected area of the first surface of said substrate;
    an electronic rectifying barrier region extending generally laterally along a part of the device where said substrate adjoins said body;
    at least one groove filled with a material which is significantly different in electrical conductivity from material of at least one of said substrate and body under both a forward and a reverse voltage applied onto the interfacial electronic rectifying barrier region; and
    said at least one groove comprising a protruding portion having a designed submicron width or thickness within one micron of at least one of said body and substrate.

2. A circuit device of claim 1 in which said substrate has a flat bottom major surface;
    said at least one groove starts at a first end of a first side thereof, terminates at a first boundary of said protruding portion, and continues at a second boundary of said protruding portion along a second side, and toward a second end of a second side, of said at least one groove; and
    normal distances to said flat bottom major surface of said substrate change monotonously from each of said first and second ends of the two sides to said protruding portion.

3. A circuit device of claim 1 in which:
    said at least one groove has a first side and a second side thereof; and
    said first side in its entity has only a positive slope while said second in its entity has only a negative slope.

4. The circuit device of claim 1 in which said at least one groove consists only of a single groove having two sides;
    a first side starting at a first end of a first side of said at least one groove, and moving monotonously in one direction on said first side toward, and terminating at a first boundary of said protruding portion; and
    a second side starting at a second end of a second side of said at least one groove, and moving monotonously in an opposite direction on said second side toward, and terminating also at a second boundary of said protruding portion.

5. The circuit device of claim 1 in which said at least one groove has two sides terminating at two respective ends of said two sides in a single protruding tip which divides, with a planer dividing plane, a first groove side from a second groove side;
    normal distances between said dividing plane and both said groove sides increasing monotonously from the single protruding tip toward both ends of said respective groove sides.

6. The circuit device of claim 1 in which said at least one groove has a central major-portion rounded bottom consisting essentially of a 100% dense, pure solid material metallurgically continuously bonded onto at least one of said substrate, body, and said electronic rectifying barrier region.

7. The circuit device of claim 1 in which said electronic rectifying barrier region is selected from the group consisting of PN junction electronic rectifying barrier region, metal-semiconductor electronic rectifying barrier region, oxide-semiconductor barrier region, interfacial rectifying barrier region, heterojunction rectifying barrier region between different semiconductor materials, and other optoelectromagnetically active signal-translating region.

8. The circuit device of claim 1 which is mass-produced and in which a tip of the protruding portion of said at least one groove is within a vertical distance from a designated point inside said electronic rectifying barrier; and said vertical distance is selected from the group consisting of 1.0 micron ("h=1 micron"), 0.1 microns, and 0 microns (i.e., "$h_m$=0").

9. The circuit device of claim 1 which is mass-produced and in which the protruding portion of said at least one groove terminates in a single protruding tip;

said protruding tip and a designated point inside the electronic rectifying barrier region is seperated by a 0.0 micron distance locally normally of the rectifying barrier region.

10. The circuit device of claim 1 which is mass-produced and in which the protruding portion of said at least one groove terminates in a single protruding tip;

said protruding tip and a designated point inside the electronic rectifying barrier region is seperated by a distance locally normally of said rectifying barrier region; and said distance being significantly less than 0.1 microns and as close to zero as possible to give maximum protection against Type I contaminants.

11. The circuit device of claim 5 in which said protruding tip and a designated point inside the electronic rectifying barrier region is seperated by a distance substantially less than 0.1 micron and close-to-zero micron locally normally of the rectifying barrier region.

12. The circuit device of claim 1 which is mass-produced and in which the protruding portion of said at least one groove terminates in a single protruding tip;

said protruding tip having a close to zero distance normally of the rectifying barrier region because of a microscopically precise groove and configuration achieving 0.1 micron accuracy in shape, size, depth and location thereby providing sufficient device yield to be competitive and commercially profitable.

13. The circuit device of claim 1 in the form of a semiconductor circuit device in which:

said solid state material substrate is a semiconductor material substrate;

said solid state material body is a semiconductor material body; and said electronic rectifying barrier region is a PN junction region.

14. The circuit device of claim 1 in which material of at least one of said substrate and body is selected from the group consisting of Si, Ge, diamond, SiC, InSb, GaAs, GaP, InP, III-V compounds, II-VI compounds, and mixture therof.

15. The circuit device of claim 1 in which said at least one groove is filled with a solid material which is orders of magnitude lower in electrical conductivity compared to those of materials of said substrate and body under any forward and reverse applied voltage on the interfacial rectifying barrier region.

16. The circuit device of claim 1 in which said at least one groove is filled with a solid, electrically insulating chemical compound of a semiconductor material.

17. The circuit device of claim 1 in which said at least one groove is filled with a solid, said solid metallurgically perfectly and continuously bonded to at least one of said substrate and body as to be free in the bonding region of defects including voids and microcracks visible at 1,000 times magnification.

18. The circuit device of claim 1 in which said at least one groove is filled with a solid and said solid is bonded to at least one of said substrate and body with a bonding region which comprises a graded seal having gradual chemical composition concentration changes so that high stress generated during device processing are spread out over wide areas providing stress relief and avoiding splitting cracks.

19. The circuit device of claim 1 in which said at least one groove comprises a first protruding portion having the designated submicron width or thickness;

said device including a second groove with a second protruding portion and a protruding direction of said first protruding portion being parallel to that of said second protruding portion.

20. The circuit device of claim 1 in which said at least one groove contacts at least one of said substrate, body, and electronic rectifying barrier region;

said device including a second groove with a second protruding portion with a second designed submicron width or thickness; and protruding direction of said first and second protruding portions being selected from the group consisting of a) horizontal; b) vertical; and c) inclined to both horizontal and vertical.

21. The circuit device of claim 1 in which said at least one groove is an elongated hole or slot of a constant lateral cross-section and having an aspect or length/width ratio of over 2.5.

22. The circuit device of claim 1 in which the protruding portion of said at least one groove is major-portion rounded at a protruding tip of said protruding portion; and said protruding tip having a substantially zero width or thickness.

23. A solid state circuit device comprising:

a solid state material substrate of one conductivity type having a first surface;

a solid state material body of opposite conductivity type placed on a selected area of the first surface of said substrate;

an electronic rectifying barrier region extending generally laterally along a part of the device where said substrate adjoins said body;

said electronic rectifying barrier region having a beneficial residual stress therein to favorably affect characteristics of said circuit device; and at least one groove filled with a material which is significantly different in electrical conductivity material of at least one of said substrate and body under both a forward and a reverse applied voltage on the interfacial rectifying barrier region; and said at least one groove comprising a solid protruding portion having a designed submicron width or thickness within one micron of at least one of said body and substrate.

24. The circuit device of claim 23 in which said at least one groove is filled with a material which is electronically inert, pure, 100% dense, gas impervious, and non-contaminated to said electronic rectifying barrier region.

25. A solid state circuit device comprising:
- a solid state material substrate of one conductivity type having a first surface;
- a solid state material body of opposite conductivity type placed on a selected area of the first surface of said substrate;
- an electronic rectifying barrier region extending generally laterally along a part of the device where said substrate adjoins said body; and
- at least one groove having a single smooth-translating curvature and filled with a non-semiconductor material which is orders of magnitude different in electrical conductivity from those of materials of said substrate and body under both a forward and a reverse applied voltage on the interfacial rectifying barrier region;
- said at least one groove comprising solid protruding portion having a designed submicron width or thickness within one micron of at least one of said body and substrate.

26. A solid state circuit device comprising:
- a solid state material substrate of one conductivity type having a first surface;
- a solid state material body of opposite conductivity type placed on a selected area of the first surface of said substrate;
- an electronic rectifying barrier region extending generally laterally along a part of the device where said substrate adjoins said body;
- at least one groove filled with a non-semiconductor material, adjoining at least one of said substrate, body, and electronic rectifying barrier region, and having a designated, submicron-accurate geometry, with respect to the electronic rectifying barrier to withstand process-induced stresses making the circuit device mechanically more stable and reliable;
- said at least one groove comprising a solid protruding portion having a designated submicron width or thickness within one micron of at least one of said body and substrate.

27. A solid state circuit device comprising: a solid state material substrate having a first surface; a solid state material body placed on a selected area of the first surface of said substrate;
- said substrate and said body forming an electronic signal-translating region extending at least generally laterally along a part of the device where said substrate adjoins said body, and
- at least one groove of a solid, non-semiconductor material adjoining at least one of said substrate, body and electrical rectifying barrier region, and having a designated submicron-accurate geometry location and position relative to the electrical rectifying barrier region;
- said electronic signal-translating region being curved in a way selected from; a) substantial portion curved; b) major portion curved; c) major central portion curved; d) curved in its entirety; and e) concavely curved when viewed from the top;
- said at least one groove comprising a solid protruding portion having a designed submicron width of thickness within one micron of at least one of said body and substrate.

28. The circuit device of claim 27 in which said electronic signal-translating region is a PN junction region and said groove is a cylindrical groove and is electrically conductive under both forward and reverse applied bias.

* * * * *